(12) United States Patent
Berberich et al.

(10) Patent No.: US 11,516,922 B2
(45) Date of Patent: Nov. 29, 2022

(54) COMPONENT HOLDING DEVICE

(71) Applicant: ebm-papst Mulfingen GmbH & Co. KG, Mulfingen (DE)

(72) Inventors: Joachim Berberich, Buchen (DE); Jan Fröhlich, Hochhausen (DE); Alexander Lust, Obersulm (DE)

(73) Assignee: ebm-papst Mulfingen GmbH & Co. KG, Mulfingen (DE)

( * ) Notice: Subject to any disclaimer, the term of this patent is extended or adjusted under 35 U.S.C. 154(b) by 673 days.

(21) Appl. No.: 16/489,751

(22) PCT Filed: May 24, 2018

(86) PCT No.: PCT/EP2018/063631
§ 371 (c)(1),
(2) Date: Aug. 29, 2019

(87) PCT Pub. No.: WO2018/219769
PCT Pub. Date: Dec. 6, 2018

(65) Prior Publication Data
US 2020/0015360 A1    Jan. 9, 2020

(30) Foreign Application Priority Data

Jun. 1, 2017   (DE) ..................... 10 2017 112 037.8

(51) Int. Cl.
*H05K 3/30*      (2006.01)
*B23K 3/08*      (2006.01)
(Continued)

(52) U.S. Cl.
CPC ............. *H05K 3/306* (2013.01); *B23K 3/087* (2013.01); *H01R 43/0263* (2013.01); *H05K 7/12* (2013.01); *B23K 2101/42* (2018.08)

(58) Field of Classification Search
CPC .......... H05K 7/12; H05K 7/14; H05K 7/1417; H05K 7/142; H05K 3/306; H05K 3/3347; H05K 2201/10606; H05K 2201/10689
(Continued)

(56) References Cited

U.S. PATENT DOCUMENTS

| 4,728,753 A | 3/1988 | Nakano |
| 5,117,330 A | 5/1992 | Miazga |

(Continued)

FOREIGN PATENT DOCUMENTS

| DE | 3609424 A1 | 10/1986 |
| DE | 102009011993 A1 | 9/2010 |
| DE | 102010028164 A1 | 10/2011 |

OTHER PUBLICATIONS

European Patent Office, Rijswijk, Netherlands, International Search Report of International Application No. PCT/EP2018/063631, dated Sep. 10, 2018, 2 pages.

*Primary Examiner* — Tuan T Dinh
(74) *Attorney, Agent, or Firm* — Dickinson Wright PLLC

(57) ABSTRACT

A component holding device for the fixed-position arrangement of an electric component on a circuit board, having a support side for receiving the electric component, wherein at least one pretensioning element and at least one first latching element for the fixed-position latching of the electric component are provided on the support side, and the at least one pretensioning element is designed to exert a pretensioning force on the electric component, which presses the electric component against the at least one first latching element, and having at least one second latching element on an underside lying opposite the support side, wherein the second latching element is designed to fix the component holding device in a predefined location in a fixed position on the circuit board.

19 Claims, 4 Drawing Sheets

(51) Int. Cl.
*H01R 43/02* (2006.01)
*H05K 7/12* (2006.01)
*B23K 101/42* (2006.01)

(58) Field of Classification Search
USPC ..... 361/756–759, 801, 807–810; 174/138 E, 174/138 G
See application file for complete search history.

(56) References Cited

U.S. PATENT DOCUMENTS

| | | | | |
|---|---|---|---|---|
| 6,327,160 | B1 * | 12/2001 | Liao | H05K 7/142 |
| | | | | 361/801 |
| 6,621,714 | B1 * | 9/2003 | Li | F16L 3/23 |
| | | | | 361/801 |
| 6,985,367 | B1 * | 1/2006 | Scigiel | H05K 7/142 |
| | | | | 361/801 |
| 7,505,286 | B2 * | 3/2009 | Brovald | H05K 7/1417 |
| | | | | 439/328 |
| 10,757,828 | B2 * | 8/2020 | Vallen | H05K 7/12 |

* cited by examiner

COMPONENT HOLDING DEVICE

CROSS-REFERENCE TO RELATED APPLICATIONS

This application is a 35 U.S.C. § 371 national phase application of International Application No.: PCT/EP2018/063631, filed May 24, 2018, which claims the benefit of priority under 35 U.S.C. § 119 to German Patent Application No.: 10 2017 112 037.8, filed Jun. 1, 2017, the contents of which are incorporated herein by reference in their entirety.

FIELD

The invention relates to a component holding device for the fixed-position arrangement of an electric component on a circuit board with tolerance compensation.

BACKGROUND

The statements in this section merely provide background information related to the present disclosure and several definitions for terms used in the present disclosure and may not constitute prior art.

Conventionally, electric components are arranged and soldered on circuit boards without any compensation for manufacturing tolerances between the electric component and the circuit board and between the electric component and an adjoining electronic housing occurring. However, this does not ensure a defined spacing of the electric component on a circuit board with respect to the electronic housing. Therefore, the electronic components are often fastened to the electronic housing itself.

Between the circuit board and the electric component to be soldered, spacers, for example, diodes, have been inserted additionally, in order to ensure a defined spacing of the electric component with respect to the circuit board during soldering. Here, it is disadvantageous that, during the soldering process, the soldering mask has to be immobilized on the electric component by means of a hold-down device. In addition, the fixing of the electric component on the circuit board is usually carried out by means of screws extending through the electric component to the circuit board (or beyond) and acting directly on the electric component during tightening. This can lead to damage or even breaking.

SUMMARY

Therefore, the underlying aim of the invention is to provide a component holding device which enables a tolerance compensation for an electric component to be fastened on a circuit board with respect to adjoining components such as an electronic housing, and a defined respective fixed-position spacing with respect to one another.

This aim is achieved by a component holding device for the fixed-position arrangement of an electric component on a circuit board, having a support side for receiving the electric component, wherein at least one pretensioning element and at least one first latching element for the fixed-position latching of the electric component are provided on the support side, and the at least one pretensioning element is designed to exert a pretensioning force on the electric component, which presses the electric component against the at least one first latching element, and having at least one second latching element on an underside lying opposite the support side, wherein the second latching element is designed to fix the component holding device in a predefined location in a fixed position on the circuit board.

Designed according to the invention is a component holding device for the fixed-position arrangement of an electric component on a circuit board, having a support side for receiving the electric component. At least one pretensioning element and at least one first latching element for the fixed-position latching of the electric component are provided on the support side, wherein the at least one pretensioning element is designed to exert a pretensioning force on the electric component, which presses the electric component against the at least one first latching element. The component holding device moreover comprises at least one second latching element on an underside lying opposite the support side, wherein the second latching element is designed to fix the component holding device in a predefined location in a fixed position on the circuit board.

Via the first latching element, a locked fastening of the electric component in a predetermined position and spacing on the support side of the component holding device occurs, wherein the pretensioning element permanently presses the electric component against the first latching element. In addition, the second latching element, on the underside lying opposite the support side, enables a fixing of the component holding device on the circuit board in an also predefined and fixed spacing. Via the double, two-sided spaced spacing establishment, the tolerance compensation occurs. In the latched state, the component holding device forms a unit with the electric component, so that the electric connections of the electric component can be soldered without additional aid. In addition, such a unit consisting of electric component and component holding device can be pressed into the circuit board and fixedly immobilized in a fixed position by means of the second latching elements.

In an embodiment of the component holding device, it is provided that the first and second latching elements can be detachably latched on the electric component or respectively the circuit board.

For such a solution, in an embodiment example, the first latching element is designed as a latching hook with a rear grip section forming an abutment for the fixed-position latching in the electric component. The second latching element is also designed as a latching hook with a rear grip section forming an abutment for the fixed-position latching in the circuit board.

The latching hooks can be provided with slanted insertion surfaces, so that they can be introduced into corresponding openings in the electric component or the circuit board and snap in resiliently after moving over the respective undercut. In a variant, on the latching hooks, multiple undercuts to be moved over successively are provided, which determine different latching positions and thus different height and spacing positions.

In the component holding device, in an embodiment, a resiliently springy pretensioning bracket is used as pretensioning element, which can exert a planar pretensioning force on the electric component. The pretensioning bracket protrudes with respect to the support side and forms a contact surface on the electric component, when said electric component is placed on the component holding device. Here, the resilient pretensioning bracket with its pretensioning force presses flat against the electric component. After the latching of the first latching element, the pretensioning force holds the electric component in a fixed-position spacing with respect to the component holding device.

In an embodiment variant, it is provided that the first latching element has a predetermined breaking point for the defined-position detachment from the component holding device. The predetermined breaking point makes it possible to remove the first latching element after the soldering of the electric component on the circuit board. The fixing is no longer necessary after the soldering. In addition, it can be ensured that no elements of the latching element protrude beyond the electric component. The electric component can thus be positioned closer to a cooling device (for example, cooling ribs, air slots) of the electronic housing and thereby the cooling capacity can be improved.

In an advantageous design of the component holding device, in an outer marginal section adjoining the outer margin of the component holding device, at least one through-hole extending from the support side to the underside is provided, through which a fastener, for example a screw, for fastening the component holding device on the circuit board can be led, without extending through the electric component. As a variant, the electric component has a recess in the region of the through-hole. The fastening thus occurs no longer with force action of the screw onto the electric component, but directly onto the component holding device. Damage to the electric component or even breaking can be prevented.

In a development of the component holding device, it is provided that first latching elements are provided on at least two opposite outer sides of the component holding device, which each comprise a holding bracket protruding from the support side. Via the holding brackets, the component holding device can be inserted more easily in the circuit board, without the electric component having to be touched. In addition, the holding bracket provides a point of attack for introducing a force for the detachment of the first latching elements at the respective predetermined breaking point from the component holding device.

Another advantageous design is one in which second latching elements are provided on at least two opposite outer sides of the component holding device, in order to provide at least two fastening points between the component holding device and the circuit board. The at least two respective latching elements on opposite outer sides enable a parallel placement and fixing of the electric component on the component holding device and of the unit consisting of electric component and component holding device on the circuit board.

In an embodiment example of the component holding device, on the support side, at least one guide bar is provided, which ensures guiding during insertion of the electric component on the component holding device. In particular, it is advantageous if on at least two opposite outer sides of the support side in each case at least one guide bar is provided, between which the electric component can be inserted on the component holding device. The guide bars facilitate the correct positioning of the electric component on the component holding device, since the electric component, guided by the guide bars, can be placed on the component holding device, until the first latching elements engage in the component holding device.

In an additional advantageous design, the component holding device is designed to form a single piece and is produced, for example, by injection molding.

Further areas of applicability will become apparent from the description provided herein. It should be understood that the description and specific examples are intended for purposes of illustration only and are not intended to limit the scope of the present disclosure.

BRIEF DESCRIPTION OF THE DRAWINGS

Additional advantageous developments of the invention are characterized in the dependent claims or represented in further detail below together with the description of the preferred design of the invention in reference to figures, in which:

The drawings are provided herewith for purely illustrative purposes and are not intended to limit the scope of the present invention. Identical reference numerals denote identical parts in the figures.

DETAILED DESCRIPTION

Figure 1:
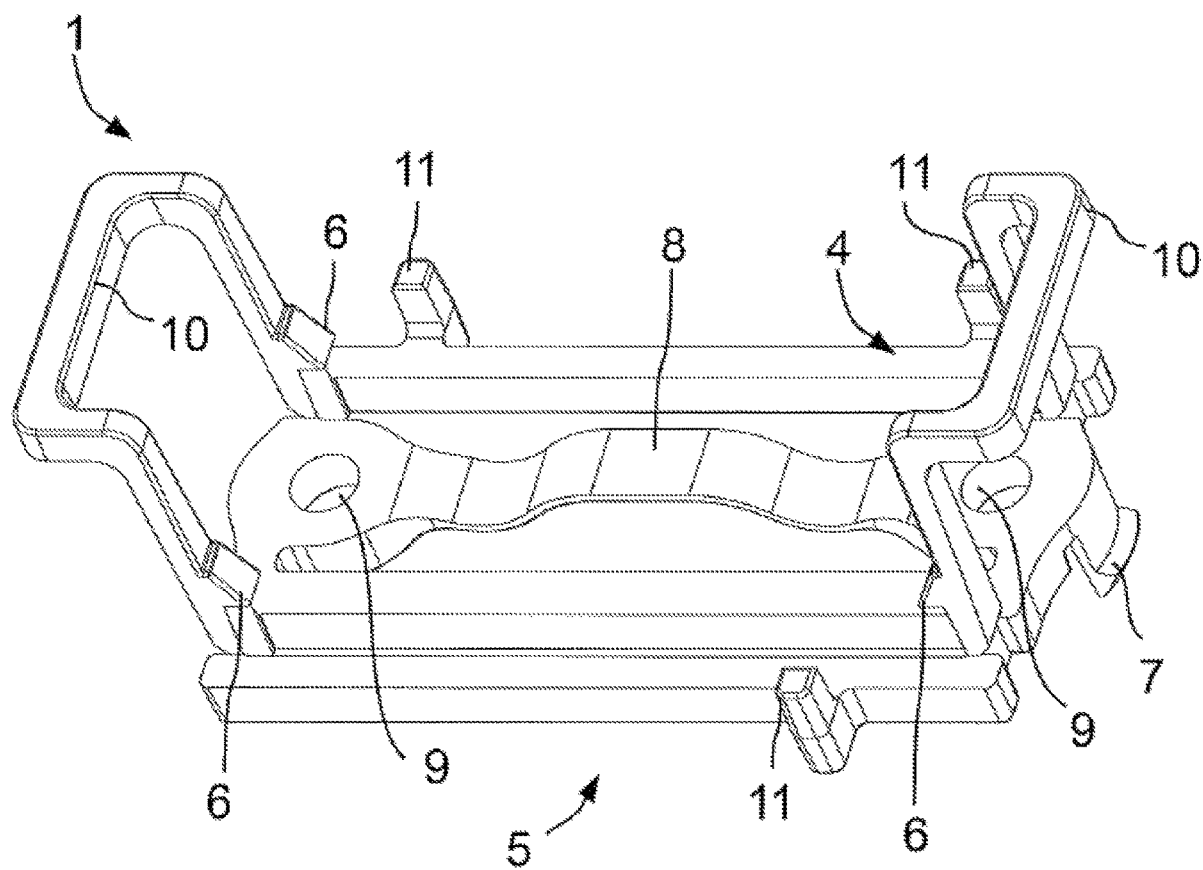
FIG. 1 shows a perspective view of a component holding device according to the invention.

The following description is merely exemplary in nature and is in no way intended to limit the present disclosure or its application or uses. It should be understood that throughout the description, corresponding reference numerals indicate like or corresponding parts and features.

In FIG. 1, a perspective view of a component holding device 1 according to the invention is shown. The component holding device 1 is used for the fixed-position arrangement of an electric component 2 (for example, a power module is represented) on a circuit board 3, as FIGS. 3 and 4 disclose. The electric component 2 is fixed on the component holding device 1, as shown in FIG. 2.

Figure 2:
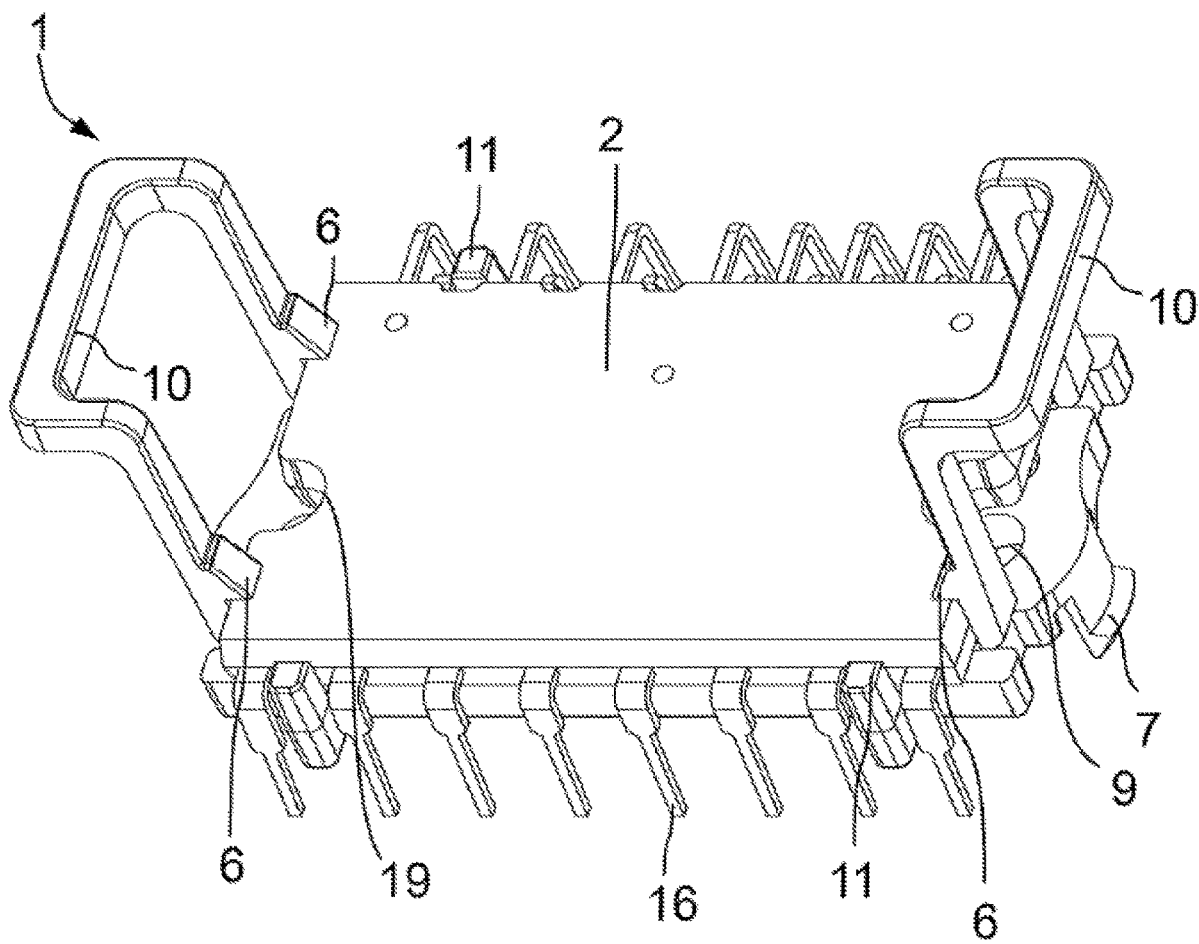
FIG. 2 shows a perspective view of the component holding device of FIG. 1 with electric component fastened thereto.
Figure 3:
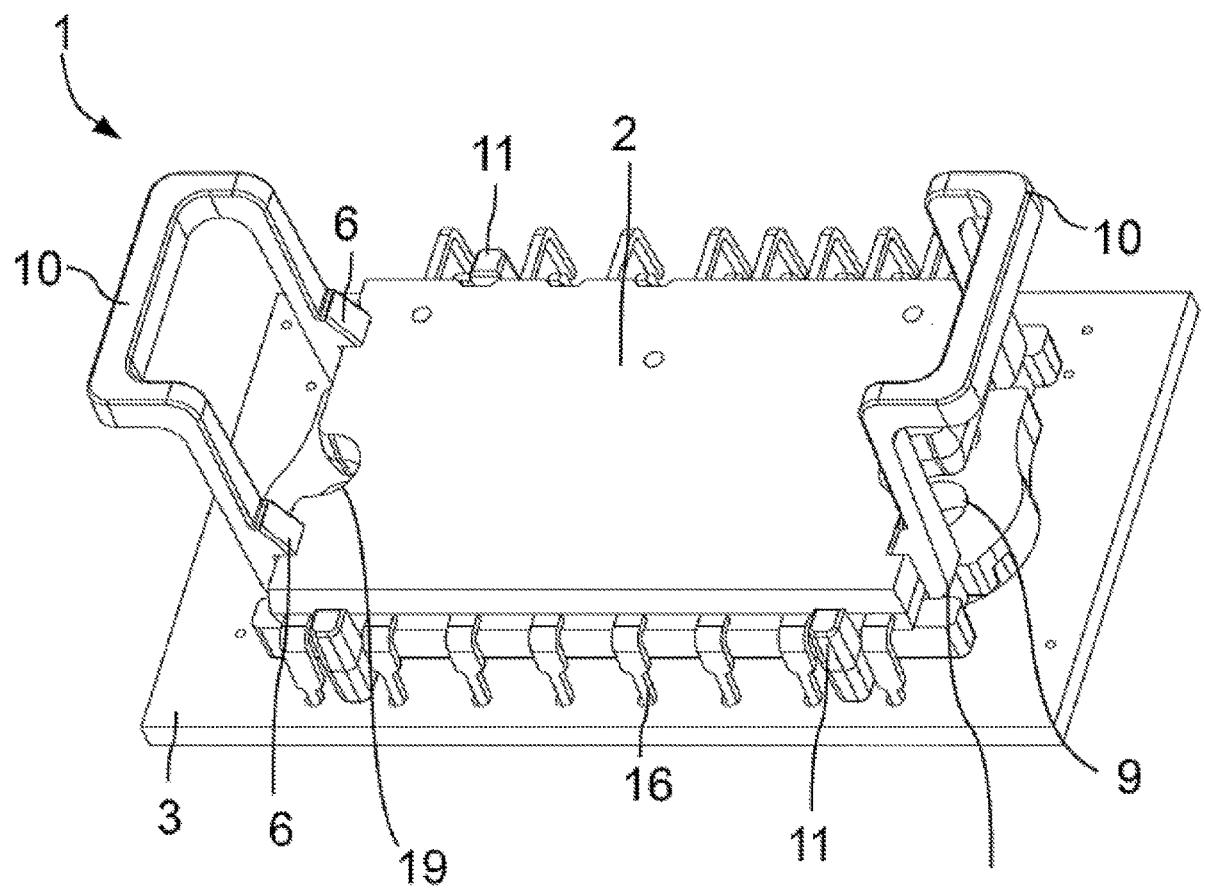
FIG. 3 shows a perspective view of the component holding device fixed on a circuit board of FIG. 2.
Figure 4:
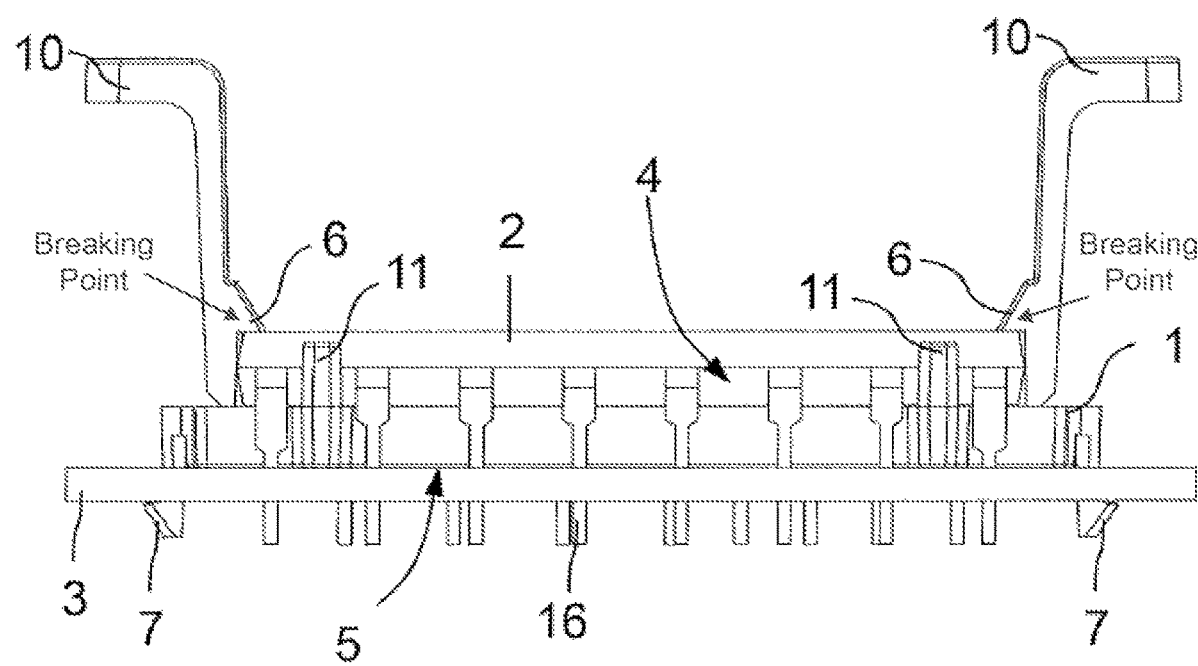
FIG. 4 shows a side view of the embodiment example according to FIG. 3.

In reference to FIGS. 1-4, the component holding device 1 comprises an upper support side 4 with a support surface for receiving the electric component 2. On the support side 4 of the component holding device 1, a resiliently springy pretensioning bracket 8 is formed, which extends between two opposite outer marginal sections of the component holding device 1 and protrudes from the contact surface, in order to exert a planar pretensioning force onto the electric component 2. The component holding device 1 moreover comprises four latching hooks 6 for the fixed-position latching of the electric component 2 to the component holding device 1. The four latching hooks 6 are each designed with a rear grip section forming an abutment for the fixed-position latching in the electric component 2, as shown in FIGS. 2-4, wherein the latching hooks 6 point inward, in order to grip around the electric component 2 on the outer margin thereof. In the inserted state, the pretensioning bracket 8 pushes the electric component 2 permanently against the abutments of the latching hooks 6. The electric component 2 is thus fixed in a fixed position with respect to the component holding device 1. In each case two latching hooks 6 are connected by holding brackets 10 formed on two opposite outer sides of the component holding device 1. Via the holding brackets 10, the component holding device 1 can be handled easily with the electric component 2 fastened thereon and positioned on the circuit board 3. In addition, the elongated protruding holding brackets 10 provide a lever by means of which the latching hooks 6 can be broken off after the fixing of the electric component 2 on the component holding device 1 or the circuit board 3. In the region of the latching hooks 6, it is possible to provide for this purpose in addition a predetermined breaking point (not shown).

The component holding device 1, on the underside 5 lying opposite the support side 4, comprises two latching hooks 7 formed in the outer marginal sections, by means of which the component holding device 1 is fixed in a predefined position in a fixed position on the circuit board 3. The latching hooks 7 also each comprise a rear grip section forming an abutment, by means of which the component holding device 1 is latched in a fixed position in corresponding openings in the circuit board 3, as shown in FIGS. 3 and 4. The rear grip sections of the latching hooks 7 are formed with a bevel in order to compensate for the tolerance of the circuit board 3.

In the outer marginal sections adjoining the outer margin of the component holding device 1, two through-holes 9, each extending from the support side 4 to the underside 5, are provided, through which a fastener, such as a screw or another suitable fastening means, can be led, in order to fasten the component holding device 1 on the circuit board 3 or on another component, not represented, under the circuit board 3. In the region of the through-holes 9, the electric component 2 comprises recesses 19, so that the fastening of the component holding device 1 can occur independently of the electric component 2. By means of this solution, the screw connection surface on the component holding device 1 can moreover be increased.

On its outer margin, the component holding device 1 comprises, on two opposite outer sides, two guide bars 11 in each case, which, during the insertion, guide the electric component 2 onto the component holding device 1 and, in the built in the installed state, ensure a lateral bracing, as represented in FIGS. 3 and 4.

For the mounting, the electric component 2 is first pushed against the pretensioning force of the pretensioning bracket 8 of the component holding device 1 until the latching hooks 6 engage behind the electric component 2. The unit shown in FIG. 2, consisting of component holding device 1 and electric component 2, then has a predefined and fixed spacing. In this state, the unit consisting of component holding device 1 and electric component 2 is placed on the circuit board 3, so that the latching hooks 7 engage behind the circuit board 3, as shown in FIGS. 3 and 4. Then, the connections 16 of the electric component 2 can be held in position on the circuit board 3 without additional aids and soldered. Finally, the holding brackets 10 are broken off with the latching hooks 6, so that the surface of the electric component 2 forms the uppermost free surface and can be placed closer to cooling devices in an electronic housing.

Within this specification, embodiments have been described in a way which enables a clear and concise specification to be written, but it is intended and will be appreciated that embodiments may be variously combined or separated without parting from the invention. For example, it will be appreciated that all preferred features described herein are applicable to all aspects of the invention described herein.

While the above description constitutes the preferred embodiments of the present invention, it will be appreciated that the invention is susceptible to modification, variation and change without departing from the proper scope and fair meaning of the accompanying claims.

The invention claimed is:

1. A component holding device for the fixed-position arrangement of an electric component on a circuit board, the component holding device comprising:
a support side with a support surface configured for receiving the electric component, wherein at least one pretensioning element and at least one first latching element for fixed-position latching of the electric component are provided on the support side, and the at least one pretensioning element is designed to exerts a pretensioning force on the electric component, which presses the electric component against the at least one first latching element,
and at least one second latching element on an underside lying opposite the support side, wherein the second latching element is configured to fix the component holding device in a predefined location in a fixed position on the circuit board;
wherein the pretensioning element is a resiliently springy pretensioning bracket which exerts a planar pretensioning force on the electric component, wherein on the support side, the resiliently springy pretensioning bracket is formed, which extends between two opposite outer marginal sections of the component holding device, the pretensioning bracket protruding with respect to the support side and forms a contact surface on the electric component, when said electric component is placed on the component holding device so that after the latching of the first latching element, the pretensioning force holds the electric component in a fixed-position spacing with respect to the component holding device.

2. The component holding device according to claim 1, wherein the first and second latching elements are detachably latched on the electric component or the circuit board, respectively.

3. The component holding device according to claim 1, wherein the first latching element is a latching hook with a rear grip section forming an abutment for the fixed-position latching in the electric component.

4. The component holding device according to claim 1, wherein the second latching element is a latching hook with a rear grip section forming an abutment for the fixed-position latching in the circuit board.

5. The component holding device according to claim 1, wherein the component holding device is formed as a single piece.

6. The component holding device according to claim 1, wherein the first latching element comprises a predetermined breaking point for defined-position detachment from the component holding device.

7. The component holding device according to claim 1, wherein, in an outer marginal section adjoining the outer margin of the component holding device, a through-hole extending from the support side to the underside is provided, through which a fastener for fastening the component holding device on the circuit board is led, without extending through the electric component.

8. The component holding device according to claim 1, wherein first latching elements are provided on at least two opposite outer sides of the component holding device, which each comprise a holding bracket protruding from the support side.

9. The component holding device according to claim 1, wherein second latching elements are provided on at least two opposite outer sides of the component holding device.

10. The component holding device according to claim 1, wherein, on the support side, at least one guide bar is provided, which is configured to ensure a guiding during insertion of the electric component on the component holding device.

11. The component holding device according to claim 1, wherein, on at least two opposite outer sides of the support side, in each case at least one guide bar is provided, between which the electric component can be inserted on the component holding device.

12. The component holding device according to claim 2, wherein the first latching element is a latching hook with a rear grip section forming an abutment for the fixed-position latching in the electric component and the second latching element is a latching hook with a rear grip section forming an abutment for the fixed-position latching in the circuit board.

13. The component holding device according to claim 1, wherein the rear grip section of the latching hook has a slanted course.

14. The component holding device according to claim 7, wherein, in a region adjoining the at least one through-hole, the component holding device comprises a locally enlarged contact surface for the fastener for fastening the component holding device on the circuit board.

15. The component holding device according to claim 12, wherein the rear grip section of the latching hook of the second latching element has a slanted course.

16. The component holding device according to claim 12, wherein the first latching element comprises a predetermined breaking point for defined-position detachment from the component holding device.

17. The component holding device according to claim 12, wherein, on the support side, at least one guide bar is provided, which is configured to ensure a guiding during insertion of the electric component on the component holding device.

18. A component holding device for the fixed-position arrangement of an electric component on a circuit board, the component holding device comprising:
 a support side for receiving the electric component, wherein at least one pretensioning element and at least one first latching element for fixed-position latching of the electric component are provided on the support side, and the at least one pretensioning element exerts a pretensioning force on the electric component, which presses the electric component against the at least one first latching element; and
 at least one second latching element on an underside lying opposite the support side, wherein the second latching element is configured to fix the component holding device in a predefined location in a fixed position on the circuit board;
 wherein the first and second latching elements are detachably latched on the electric component or the circuit board, respectively;
 wherein the first latching element is a latching hook with a rear grip section forming an abutment for the fixed-position latching in the electric component and the second latching element is a latching hook with a rear grip section forming an abutment for the fixed-position latching in the circuit board;
 wherein, in an outer marginal section adjoining an outer margin of the component holding device, a through-hole extending from the support side to the underside is provided, through which a fastener for fastening the component holding device on the circuit board is led, without extending through the electric component.

19. The component holding device according to claim 18, wherein, in a region adjoining the at least one through-hole, the component holding device comprises a locally enlarged contact surface for the fastener for fastening the component holding device on the circuit board.

* * * * *